(12) United States Patent
Samp et al.

(10) Patent No.: US 9,797,956 B2
(45) Date of Patent: Oct. 24, 2017

(54) SYSTEM AND METHOD FOR TESTING ALTERNATOR DEFAULT MODE OPERATION

(71) Applicant: Bosch Automotive Service Solutions Inc., Warren, MI (US)

(72) Inventors: Chad Samp, Albert Lea, MN (US); David Vossen, Kalamazoo, MI (US)

(73) Assignee: Bosch Automotive Service Solutions Inc., Warren, MI (US)

( * ) Notice: Subject to any disclaimer, the term of this patent is extended or adjusted under 35 U.S.C. 154(b) by 148 days.

(21) Appl. No.: 14/950,055

(22) Filed: Nov. 24, 2015

(65) Prior Publication Data

US 2017/0146602 A1 May 25, 2017

(51) Int. Cl.
*G01R 31/34* (2006.01)

(52) U.S. Cl.
CPC .................... *G01R 31/34* (2013.01)

(58) Field of Classification Search
CPC .. G01R 31/007; G01R 31/343; G01R 31/006; G01R 31/34; F02N 11/08; G06F 7/10; G06F 15/00; G06F 19/00
See application file for complete search history.

(56) References Cited

U.S. PATENT DOCUMENTS

| | | |
|---|---|---|
| 1,313,061 A | 8/1919 | Brown |
| 2,578,694 A | 12/1951 | Goldman |
| 3,745,456 A | 7/1973 | Kahler |
| 3,893,029 A | 7/1975 | Vensel et al. |
| 3,903,737 A | 9/1975 | Burden et al. |
| 3,936,744 A | 2/1976 | Perlmutter |
| 4,070,624 A | 1/1978 | Taylor et al. |
| 4,500,304 A | 2/1985 | Foster |
| 4,641,534 A | 2/1987 | Schneider et al. |
| 4,666,122 A | 5/1987 | Goodard |
| 4,781,665 A | 11/1988 | Walker |
| 4,832,666 A | 5/1989 | Henderson |
| 4,849,665 A | 7/1989 | Kitamura et al. |
| 4,867,427 A | 9/1989 | Cunningham |
| 4,945,272 A | 7/1990 | Ochi et al. |
| 4,980,589 A | 12/1990 | Ochi et al. |
| 5,040,493 A | 8/1991 | Gajewski et al. |
| 5,125,376 A | 6/1992 | Williams et al. |
| 5,156,573 A | 10/1992 | Bytzek et al. |
| 5,195,366 A | 3/1993 | Duncan |

(Continued)

*Primary Examiner* — Francis Gray
(74) *Attorney, Agent, or Firm* — Baker Hostetler LLP

(57) ABSTRACT

A tester for a default mode of operation of an alternator is provided. The tester includes an internal memory having computer executable instructions and a processor coupled to the internal memory and to an alternator via a communication bus. The processor is configured to execute the computer executable instructions in the internal memory to provide at least one parameter associated with a vehicle to the alternator simulated as a communication signal over the communication bus, detect an absence of the communication signal at the alternator, test, upon detecting the absence of the communication signal, whether or not the alternator enters a default mode of operation, the default mode being indicated by a preset output voltage uniquely associated with the default mode and monitored by the processor, and indicate whether the alternator entered the default mode successfully.

20 Claims, 6 Drawing Sheets

(56) References Cited

U.S. PATENT DOCUMENTS

| | | | |
|---|---|---|---|
| 5,243,324 A * | 9/1993 | Bober | G01R 31/007 280/5.501 |
| 5,473,208 A | 12/1995 | Stihi | |
| 5,541,840 A | 7/1996 | Gurne et al. | |
| 5,550,485 A | 8/1996 | Falk | |
| 5,568,916 A | 10/1996 | Gibbons et al. | |
| 5,689,517 A | 11/1997 | Ruparel | |
| 5,701,089 A | 12/1997 | Perkins | |
| 5,705,870 A | 1/1998 | Thomsen et al. | |
| 5,718,196 A | 2/1998 | Uchiyama et al. | |
| 5,816,568 A | 10/1998 | Fox | |
| 5,938,169 A | 8/1999 | Ogawa et al. | |
| 6,009,363 A | 12/1999 | Beckert et al. | |
| 6,026,461 A | 2/2000 | Baxter et al. | |
| 6,147,426 A | 11/2000 | Lepi et al. | |
| 6,175,789 B1 | 1/2001 | Beckert et al. | |
| 6,181,992 B1 | 1/2001 | Gurne et al. | |
| 6,226,305 B1 | 5/2001 | McLoughlin et al. | |
| 6,276,194 B1 | 8/2001 | Vinton et al. | |
| 6,292,931 B1 | 9/2001 | Dupenloup | |
| 6,304,012 B1 | 10/2001 | Chen et al. | |
| 6,304,016 B1 | 10/2001 | Frederick et al. | |
| 6,394,250 B1 | 5/2002 | Ouchi | |
| 6,466,025 B1 | 10/2002 | Klang | |
| 6,480,723 B1 | 11/2002 | Davidson et al. | |
| 6,553,039 B1 | 4/2003 | Huber et al. | |
| 6,634,896 B1 | 10/2003 | Potega | |
| 6,647,027 B1 | 11/2003 | Gasparik et al. | |
| 6,674,046 B2 | 1/2004 | Gitter et al. | |
| 6,687,263 B2 | 2/2004 | Oldenborgh et al. | |
| 6,704,829 B1 | 3/2004 | Hoshi et al. | |
| 6,738,696 B2 | 5/2004 | Oi | |
| 6,777,945 B2 * | 8/2004 | Roberts | G01R 31/007 324/426 |
| 6,791,332 B2 | 9/2004 | Raichle | |
| 6,803,748 B2 | 10/2004 | Peter | |
| 6,834,631 B1 | 12/2004 | Blackburn et al. | |
| 6,895,809 B2 | 5/2005 | Raichle | |
| 6,986,292 B2 | 1/2006 | Kemnade | |
| 7,134,325 B2 | 11/2006 | Krampitz et al. | |
| 7,150,186 B2 | 12/2006 | Murphy et al. | |
| 7,152,464 B2 | 12/2006 | Krampitz et al. | |
| 7,212,911 B2 | 5/2007 | Raichle et al. | |
| 7,246,015 B2 | 7/2007 | Bertness et al. | |
| 7,472,820 B2 | 1/2009 | Krampitz et al. | |
| 7,640,795 B2 | 1/2010 | Raichle | |
| 7,642,786 B2 * | 1/2010 | Philbrook | G01R 31/3627 324/426 |
| 7,690,573 B2 | 4/2010 | Raichle et al. | |
| 7,696,759 B2 | 4/2010 | Raichle et al. | |
| 2004/0163501 A1 | 8/2004 | Chen | |
| 2006/0119365 A1 | 6/2006 | Makhija | |
| 2014/0260577 A1 * | 9/2014 | Chinnadurai | G01R 31/34 73/114.59 |
| 2014/0278159 A1 * | 9/2014 | Chinnadurai | G01R 31/007 702/58 |
| 2016/0216335 A1 * | 7/2016 | Bertness | G01R 31/343 |
| 2017/0146580 A1 * | 5/2017 | Ewen | G01R 31/006 |

* cited by examiner

SYSTEM AND METHOD FOR TESTING ALTERNATOR DEFAULT MODE OPERATION

FIELD OF THE DISCLOSURE

The present disclosure pertains to the field of testing vehicle motor rotary accessory devices. More particularly, the present disclosure relates to a system and a method for testing a default mode of operation of an alternator.

BACKGROUND OF THE DISCLOSURE

In the vehicle industry, certain rotary accessory devices are often used in connection with vehicle motors. One such accessory device is an alternator. An alternator is used in connection with an engine and is typically belt driven by the engine. The alternator has internal components, which when rotated, supply electrical power to a vehicle and/or an engine. The alternator communicates bi-directionally with an engine controller and other electronic control units (ECUs) of the vehicle. Such bi-directional communication provides data from sensors on the vehicle in the form of one or more parameters to the alternator. This communication begins when the alternator is started and ideally continues throughout the operation of the vehicle. The alternator is controlled by the vehicle (e.g., the engine controller or other ECUs) based on the feedback from the alternator itself The operation of the alternator consumes energy from the engine, and hence fuel.

However, there are scenarios in which the alternator fails to establish communication with the engine controller at startup, and/or loses communication with the engine controller during operation. Such a disruption in the communication between the alternator and the engine controller can cause the alternator and/or the vehicle itself to malfunction. For example, when the alternator loses communication with the engine controller, the alternator continues to provide the same output as prior to losing the communication, when a lower output may suffice. However, if the alternator continues to provide a higher output than is needed, this may result in lower engine fuel efficiency.

Accordingly, there is a need to test such scenarios in which the communication between the alternator and the engine is disrupted or did not initiate at startup of the alternator.

SUMMARY OF THE DISCLOSURE

The foregoing needs are met, to a great extent, by the present disclosure, wherein in one aspect, a system and method for testing a default mode of operation of an alternator are provided. For example, when the communication between the alternator and the engine controller does not initiate at a startup of the alternator, or when such communication was disrupted during a course of operation of the alternator for some reason, the alternator should ideally switch to operating in one of the default modes of the alternator. Such default modes allow the vehicle in which the alternator was installed to operate safely, e.g., in a limp-home mode of the vehicle. Various aspects of this disclosure are directed to testing whether or not a bi-directional communication type alternator enters a default mode of operation when the bi-directional communication is disrupted and/or is absent at the startup of the alternator.

In accordance with one embodiment of the present disclosure, a method for testing a default mode of an alternator is provided. The method includes detecting, with a processor of a tester, an absence of a communication signal at an alternator coupled to the tester. The communication signal is simulated by the tester to include at least one parameter associated with a vehicle. The method includes testing, with the processor, upon detecting the absence of the communication signal, whether or not the alternator enters a default mode of operation. The default mode is indicated by a preset output voltage uniquely associated with the default mode and monitored by the processor. The method includes indicating, with the processor, whether the alternator failed or passed said testing.

In accordance with another embodiment of the present disclosure, a tester for a default mode of operation of an alternator is provided. The tester includes an internal memory having computer executable instructions, and a processor coupled to the internal memory and to an alternator via a communication bus. The processor is configured to execute the computer executable instructions in the internal memory to provide at least one parameter associated with a vehicle to the alternator simulated as a communication signal over the communication bus, detect an absence of the communication signal at the alternator, test, upon detecting the absence of the communication signal, whether or not the alternator enters a default mode of operation, the default mode being indicated by a preset output voltage uniquely associated with the default mode and monitored by the processor, and indicate whether the alternator entered the default mode successfully.

In accordance with yet another embodiment of the present disclosure, a non-transitory computer readable medium of a tester for an alternator is provided. The non-transitory computer readable medium includes computer executable instructions thereupon. The non-transitory computer readable medium when executed by a processor of the tester cause the processor to provide at least one parameter associated with a vehicle to the alternator simulated in a communication signal over a communication link, detect an absence of the communication signal at the alternator, test, upon detecting the absence the communication signal, whether or not the alternator enters a default mode of operation, the default mode being indicated by a preset output voltage uniquely associated with the default mode and monitored by the processor, and indicate whether the alternator entered the default mode successfully.

There has thus been outlined, rather broadly, certain embodiments of the disclosure in order that the detailed description herein may be better understood, and in order that the present contribution to the art may be better appreciated. There are, of course, additional embodiments of the present disclosure that will be described below and which will form the subject matter of the claims appended hereto.

In this respect, before explaining at least one embodiment of the present disclosure in detail, it is to be understood that the present disclosure is not limited in its application to the details of construction and to the arrangements of the components set forth in the following description or illustrated in the drawings. The present disclosure is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present disclosure. It is important, therefore, that the claims be regarded as including such equivalent constructions insofar as they do not depart from the spirit and scope of the present disclosure.

DETAILED DESCRIPTION

Figure 1:
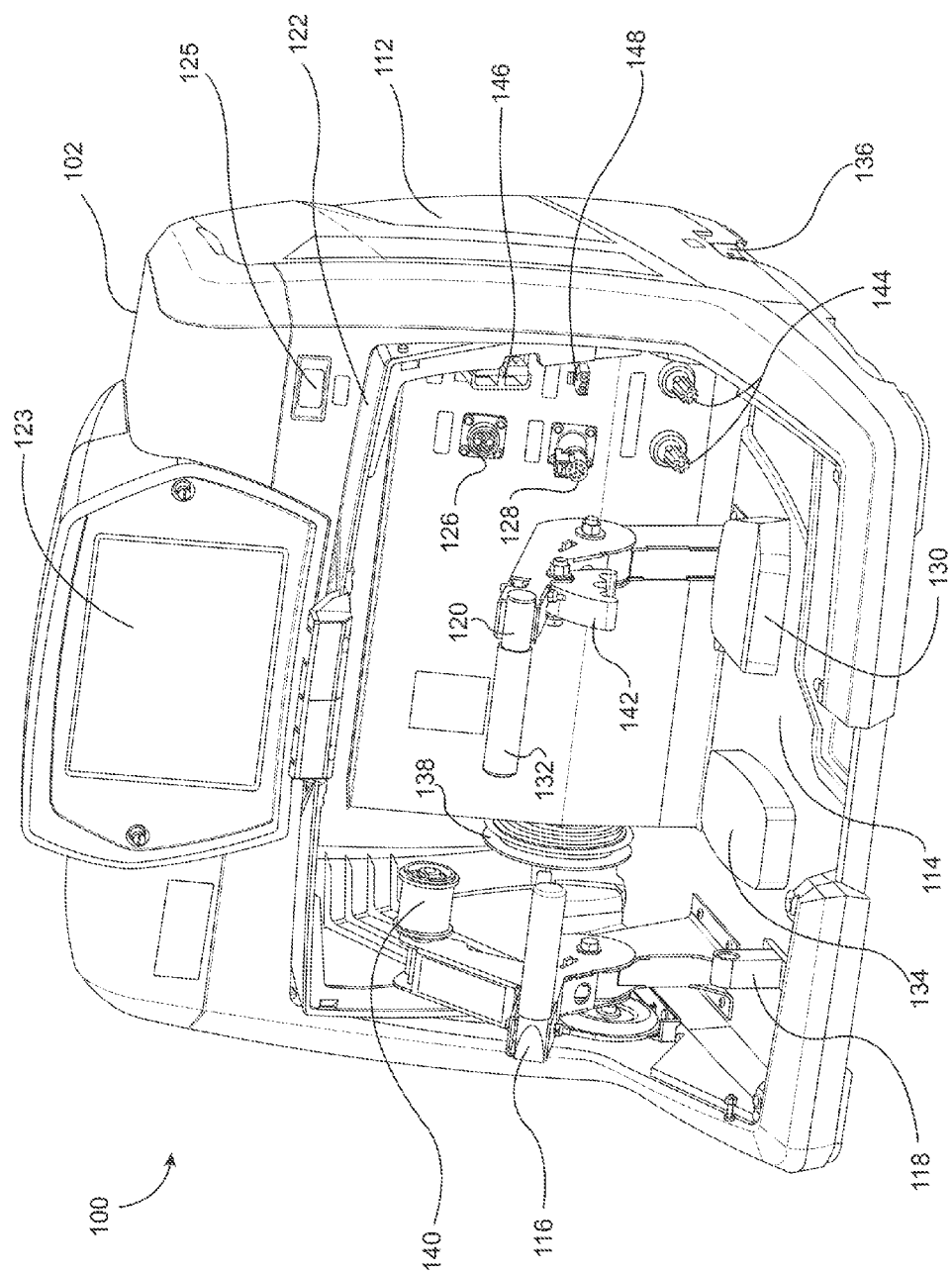
FIG. 1 is a perspective view of a tester, according to an exemplary embodiment of the present disclosure.

The present disclosure will now be described with reference to the drawing figures, in which like reference numerals refer to like parts throughout. An embodiment in accordance with the present disclosure provides an alternator and tester motor in a tester for testing an alternator's default mode(s) of operation. Such testing may be bench testing or off-board testing with the alternator placed inside a vehicle or a machine. In a vehicle, the alternator may be in bi-directional communication with an engine controller and/or other electronic controller units (ECUs) of a vehicle. The present disclosure simulates such bi-directional communication of the alternator using a tester, as discussed herein. The alternator is controlled by the vehicle based on the feedback from the alternator itself and other sensors within a charging system of the vehicle. The alternator may work with the charging system and the engine to optimize fuel efficiency and improve mileage. Such optimization occurs by limiting the amount of time the alternator is charging the vehicle's electrical system and/or by controlling an output voltage provided by the alternator, which will limit the load on the engine and thus use less fuel.

There may occur scenarios where the communication between the alternator and the engine controller and/or other ECUs is lost/disrupted, or is non-existent at the beginning of the operation of the alternator, i.e., at a startup of the alternator. In such scenarios, the alternator ideally should still charge the vehicle's electrical system in one or more default modes of operation, which are indicated by a predetermined output voltage or other operating parameters of the alternator provided to the vehicle's electrical components and system. For example, a first default mode may occur during a startup of the alternator and a second default mode may occur immediately after an established bi-directional communication has been lost. There are specific conditions for each type of default mode to begin and these vary by part manufacturer and communication type. However, conventional alternators do not ensure that all variations of default modes have been tested and that the alternator will properly enter one or more default modes when there is an absence of or a disruption in the bi-directional communication between the alternator and the engine controller/ECUs.

Various aspects of this disclosure are directed to a system and a method for testing a default mode of operation of the alternator, e.g., prior to the alternator being installed in a vehicle or another machine. Such testing ensures that the alternator will enter one or more of the default modes of operation in the event of an absence of communication with the engine controller and/or ECUs of the vehicle or a machine.

Referring to FIG. 1, a system 100 for testing one or more default modes of an alternator apparatus is illustrated in FIG. 1. Referring now to the figures wherein like reference numbers refer to like elements, FIG. 1 illustrates a tester 102 including a housing 112 and a base plate (or chassis) 114. The housing 112 surrounds and supports various operative components of the tester 102 including, for example, a power supply, diagnostic electronics, mounting devices, a monitor screen 123, a protective door cover 122, and the like. In one embodiment, the monitor screen 123, e.g., a liquid crystal display (LCD) touch-screen, may be disposed within the housing 112. A test power button 125, such as a toggle-switch, is provided on the housing 112 to activate and de-activate test power to a drive motor (not shown) or a tester motor 230 (shown in FIG. 2) and/or a transformer 422 (shown in FIG. 4). A main power switch 136 may be used to provide power to the tester 102. The tester motor 230 may be referred to as a starter motor.

The tester 102 may include an alternator belt tensioning arrangement 116, an alternator mounting arrangement 118, and a tester motor holder arrangement 120. Each of the alternator belt tensioning arrangement 116, the alternator mounting arrangement 118, and the tester motor holder arrangement 120 are mounted directly to the base plate 114. However, in other embodiments, they can be mounted to any part of the housing 112.

Figure 6:
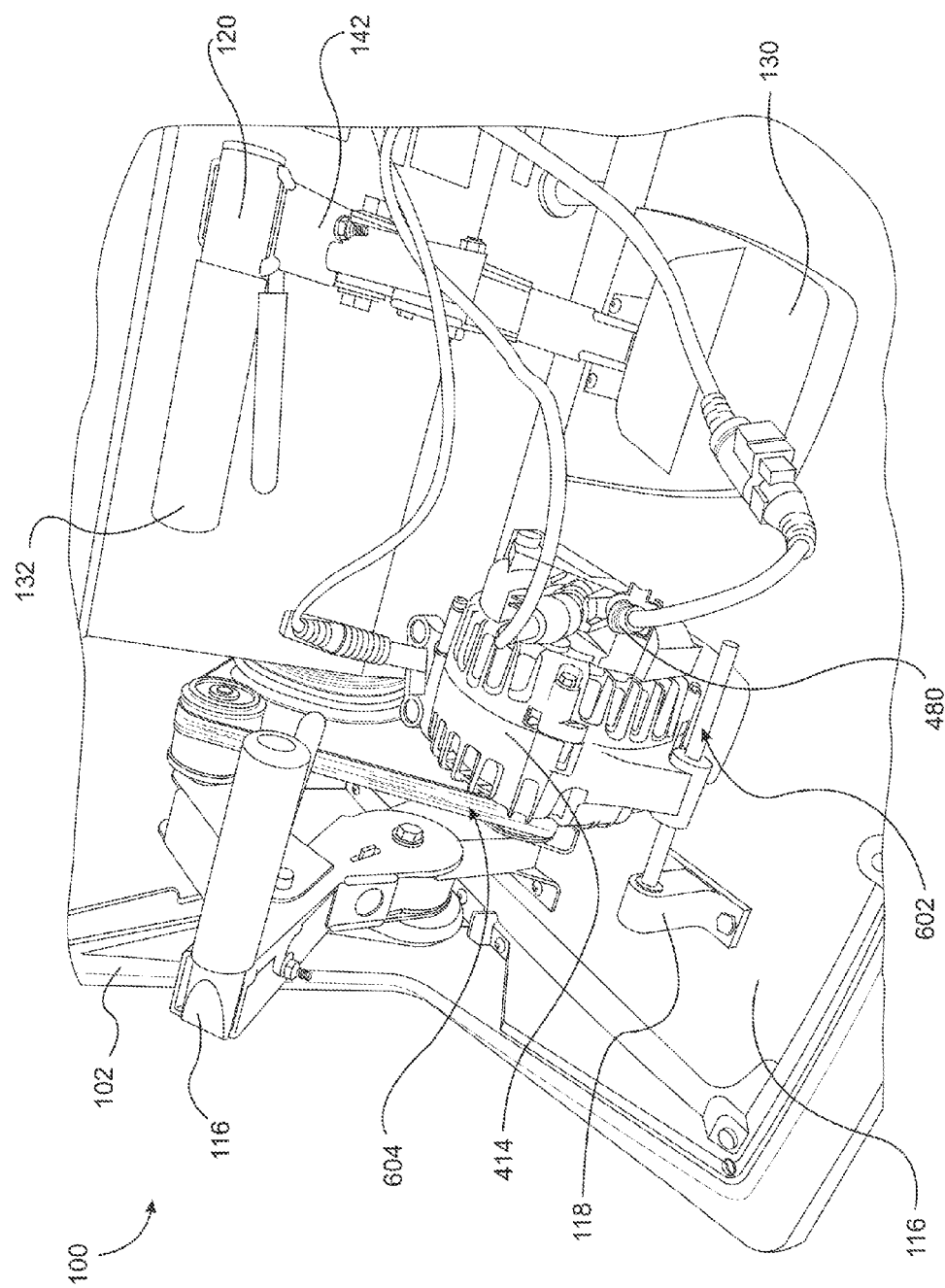
FIG. 6 illustrates an example connection of an alternator in the tester of FIG. 1, according to an exemplary embodiment of this disclosure.

The alternator belt tensioning arrangement 116 and the mounting arrangement 118 together hold an alternator 414 (shown in FIGS. 4 and 6) in place for testing. An installation assembly that includes one or more mounting pins 602 (shown in FIG. 6) can be placed in the mounting arrangement 118 in order to mount the alternator 414. The alternator 414 can be horizontally or vertically mounted depending on the type of the alternator 414. The mounting pins 602 are replaceable to allow flexibility for current and future applications.

Also shown in FIG. 1, a test adapter 128 and an alternator cable connection 126 can be connected to the alternator 414 and/or the tester motor 230 in order to provide test information to tester 102 and power to components being tested. Additionally, a drive belt 604 (shown in FIG. 6), such as a serpentine or V-type belt or the like, can be connected to the alternator 414 and the tester motor 230 to simulate the operating environment in the vehicle. A mechanical ratchet system of the alternator belt tensioning arrangement 116 may be used for belt tension to ensure consistent belt tension during testing, thereby eliminating over tensioning or belt slippage that may affect test results.

The tester motor holder arrangement 120 includes a quick release ratchet system, wherein a starter motor 412 (shown in FIG. 4) is placed on a support pad 130 and held in place by the ratchet system. The tester motor holder arrangement 120 includes the support pad 130 and a handle 132 having a release lock that when operated engages and disengages a lock (pawl, for example) from a ratchet (both not shown). The tester motor holder arrangement 120 helps to eliminate the use of straps, and alternatively uses the quick ratchet to hold the starter motor 412 without the need of any additional holding mechanism or end user assistance during the test. Thus, the aforementioned arrangement makes the loading and unloading of components to be tested much more efficient. The starter motor 412 may be placed on the support pad 130 for testing. Upon the placement, the operator squeezes the release lock and presses down on the handle 132 to engage the starter motor 412 and then releases the lock so that the lock is again reengaged. The starter motor 412 may be powered by a transformer (not shown) in order to simulate operating environments. The transformer 422 may be powered by an external power source and may provide test power to the starter motor 412 via a heavy duty cable and clamps. A solenoid connection 144, including, for example, a battery lead, ground lead, a solenoid lead and sense lead are connected to the starter motor 412 in order to conduct the tests.

FIG. 1 also illustrates the monitor screen 123 that can operate as a touch-screen LCD user interface that communicates with a controller (discussed below) as well as to display information to the end user. The present invention also utilizes an on-line tutorial for quickly training new personnel on the unit's functionality and on-line help screens to help new users navigate and test components during a test. The monitor screen 123 may offer step-by-step instructions for setting up the tester 102 and conducting tests. The monitor screen 123 may also display on-screen hook up diagrams and a specification library database, which eliminate the need for paper flipcharts and enables software updates for new alternator applications or starter configurations. This database can be updated by compact flash, flash drive, and other memory media or remotely via a network connection (discussed below). The monitor screen 123 may allow end users to run advertising screens when the tester 102 is not in use. These screens can be uploaded to the tester 102 from an end user's network server or uploaded from a compact flash or other memory media. Additionally, the monitor screen 123 may be capable of displaying information in various updatable languages. The tester 102 may output "Good/Bad" or "Pass/Fail" results to an end user. An end user printout that details test results and provides technical advice for other potential problems can be provided to the end user.

In an embodiment, the tester 102 may include additional components for testing the alternator 414. For example, the tester 102 may include an alternator rest pad 134, a multi-groove alternator drive pulley 138, an alternator idler pulley 140, a tester motor top support pad 142, and the solenoid connection 144. A base of the alternator 414 to be tested is placed on the alternator rest pad 134. The multi-groove alternator drive pulley 138 may be coupled to an output shaft of a tester motor 230 (shown in FIG. 2) inside the tester 102. The tester motor 230 may also be referred to as an alternator drive motor that drives the alternator 414. The multi-groove alternator drive pulley 138 has multiple grooves and depending upon which groove of the multi-groove alternator drive pulley 138, the drive belt 604 is placed, an input to the alternator 414 to be tested may be varied. In this respect, the alternator 414 has a variable sized pulley to which a rotational input is provided by a belt coupling a fixed pulley of the tester motor 230 to the variable sized pulley of the alternator 414, implemented using the multi-groove alternator drive pulley 138. A preset output voltage may be output by the alternator 414, and the preset output voltage is a function of a size of the variable sized pulley implemented using the multi-groove alternator drive pulley 138. In one aspect, the default mode is indicated by the preset output voltage uniquely associated with the default mode of the alternator 414 and monitored by a processor 204 (shown in FIG. 2). For example, the processor 204 may communicate with a voltage reading device (e.g., a voltmeter) to obtain the preset output voltage of the alternator 414, or for that matter, output voltage of the alternator 414 at all times of operation of the alternator 414.

The rotational input may be provided to the alternator 414 from the tester motor 230 at a predetermined angular speed. The predetermined angular speed may be stored in an internal memory 208 (shown in FIG. 2) and accessed by the processor 204 (also shown in FIG. 2) of the tester 102 to command the tester motor 230 to output the rotational input to the alternator 414. The alternator idler pulley 140 is configured to hold the alternator belt tensioning arrangement 116. An example arrangement showing an alternator similar to the alternator 414 placed inside the tester 102 is disclosed in U.S. Pat. No. 8,991,803 owned by the current applicant, incorporated by reference herein in its entirety.

Likewise, the starter motor 412 may be placed between the support pad 130 and the tester motor top support pad 142. A starter cable connection or power point 146 and/or a solenoid cable connection or power point 148 provide an initial electrical power to the starter motor 412 once the main power switch 136 has been turned to an "ON" position to receive a mains supply power at the tester 102.

Figure 2:
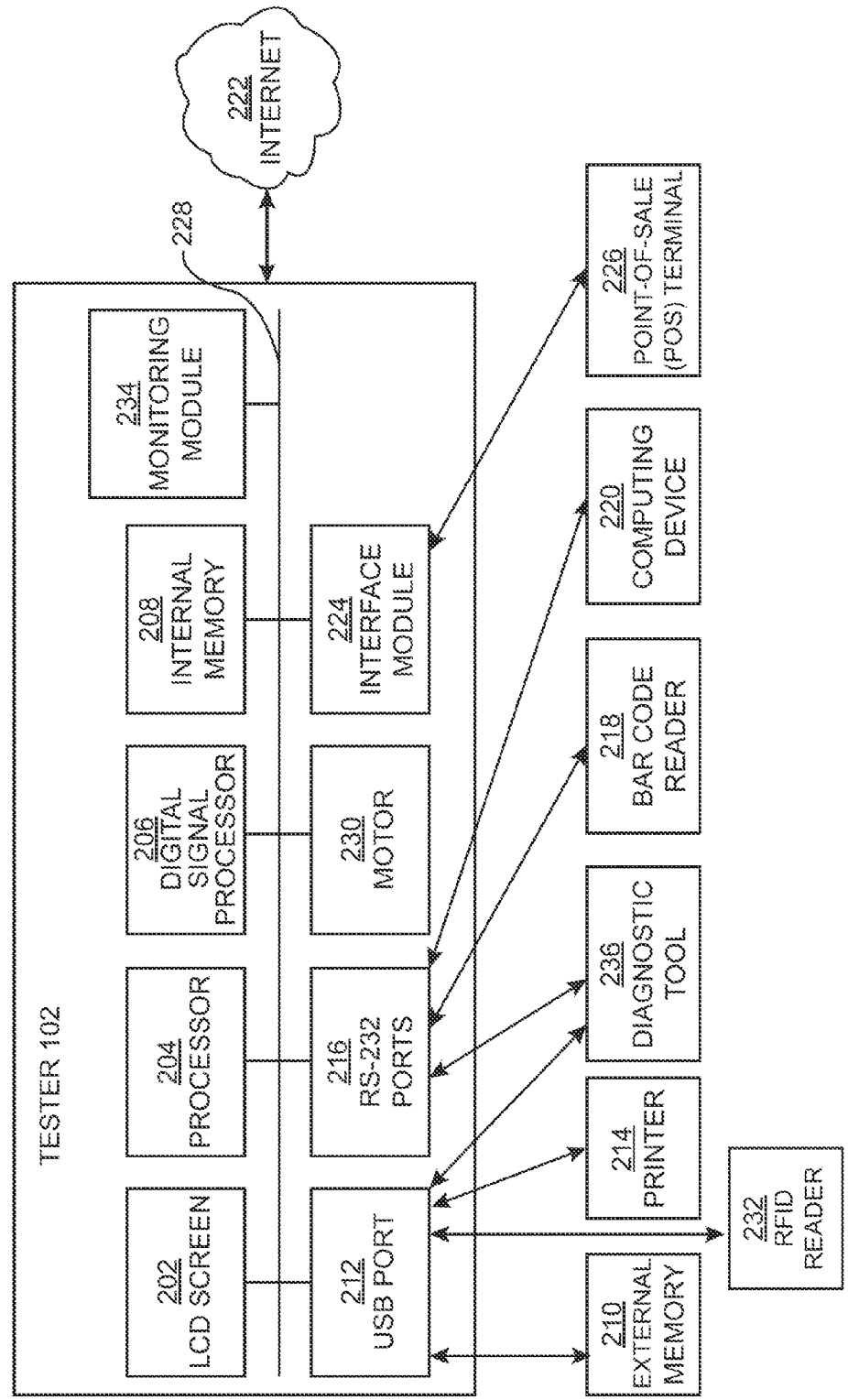
FIG. 2 is a block diagram of the main components of the tester, according to an exemplary embodiment of the present disclosure.

FIG. 2 is a schematic block diagram of a test bench or test setup 200 of the components of the tester 102 as previously described and shown in FIG. 1, according to an exemplary embodiment of the present disclosure. The components generally include the monitor screen 123, for example, a liquid crystal display (LCD) screen 202 that may present various information to a user of the tester 102 and/or the test bench 200. The LCD screen 202 may be a touch panel to input information as desired by the user and can be controlled by the processor 204. The processor 204 may be any processor or controller, including a FPGA (Field Programmable Gate Array) or application-specific integrated circuit (ASIC). The processor 204 is capable of running various operating systems (OSs), including but not limited to, Linux, OS X® provided by Apple, Inc. of Cupertino, Calif., Windows® operating system provided by Microsoft Corporation of Redmond, Wash., and the like. The processor 204 communicates with a digital signal processor (DSP) 206, which may include an analog to digital (A/D) converter, a digital to analog converter (ADC), an encoder, a quantizer, and other electronic circuitry. The processor 204 communicates with other components (e.g., an external computing device 220, the internal memory 208, a universal serial bus (USB) port 212, RS-232 ports 216, the tester motor 230, an interface module 224 and/or a monitoring module 234) of the tester 102 via a communication bus 228. The various components external to the tester 102 may communicate with the tester 102 via the USB port 212m the RS-232 ports 216, the Internet 222, via a wired or wireless connection either as shown in FIG. 2 or other configurations.

The processor 204 is configured to communicate with the internal memory 208 and an external memory 210. The internal memory 208 and/or the external memory 210 can be a memory including but not limited to compact flash, SD (secure digital), USB flash drives, and the like. A universal serial bus (USB) port 212 communicates with the processor 204 and provides a connection for various USB compatible devices. The USB port 212 may communicate as USB 1.1 or USB 2.0, 3.0 or other data rates. The RS-232 ports 216 also communicate with the processor 204 and provide a connection for various external devices. The USB compatible and external devices may include, for example, the external memory 210, a printer 214, a bar code reader 218, the external computing device 220, a point-of-sale terminal 226, a radio frequency identification (RFID) reader 232 and/or a diagnostic tool 236. It will be appreciated by one of ordinary skill in the art that the tester 102 may communicate with external devices (e.g., the external computing device 220) over wireless and/or wired channels.

The RFID reader 232 is configured to read identifying information about the tested component containing an RFID chip once the RFID chip is within a detection range. The RFID chip may be integrated or separated from the tested component. The RFID chip may contain information about the alternator 414 or tester motor 230 such as type, serial number, manufacturer, date of production or shipment, place of production or shipment, previous test results, electrical specifications, diagnostic specification, maintenance information, bulletins, serial number, lot number, warranty information, a manufacture data code, method of shipment and the like.

The external computing device 220 can be any computing device, including a personal computer, a laptop, a tablet, a personal digital assistant (PDA), a smart phone or the like. In another embodiment, the USB port 212 and the RS-232 ports 216 may accommodate a data cable that may connect to a data link connector in a vehicle to retrieve diagnostic information, such as diagnostic trouble codes (DTCs), which may then be provided to the tester 102 via the external computing device 220, or directly. In one aspect of this disclosure, the external computing device 220 may simulate engine signals and provide those to the processor 204 and/or the DSP 206. Such simulated signals may include information related to sensor parameters for different vehicles, (e.g., tire pressure, temperature, fuel efficiency, etc.). These signals may then be provided to the alternator 414 inside the tester 102 on the test bench 200, e.g., over a communication port 480 of the alternator 414 illustrated in FIGS. 4 and 6. The alternator 414 may form a bi-directional communication link with the processor 204 implemented, for example, by the communication bus 228, DSP 206, and/or the external computing device 220 to simulate a bi-directional communication link between an engine controller or other electronic control units (ECUs) of a vehicle and the alternator 414 inside the vehicle. The bi-directionality of the communication between the alternator 414 and the processor 204, DSP 206, and/or the external computing device 220 allows for feedback to modify operation of the alternator 414 on the tester 102. Such feedback may mimic a feedback the alternator 414 receives/provides when inside the vehicle from the engine controller and/or other ECUs to modify an output of the alternator 414. In the absence of this feedback over the bi-directional communication link, the alternator 414 may continue to provide an output voltage at a value higher than that needed by the vehicle's electrical system, thereby wasting unnecessary fuel in the engine that uses the fuel to provide the rotational input to the alternator 414.

Similarly, the diagnostic tool 236 can be any computing device and can provide additional diagnostic information to the tester 102. The additional diagnostic information may include diagnostic trouble codes (DTCs) that are set in a vehicle's electronic control unit. The DTCs can be used in the tester 102 as part of an analysis carried out at the tester 102 to determine if the issue is with the component under test or another component in the vehicle.

The bar code reader 218 allows the user to scan bar code information that may be attached to the tested component or the VIN (vehicle identification number) of the vehicle from which the tested component came from. The bar code reader 218 may be, for example, an optical bar code reader, such as a wand type reader. The bar code may provide a variety of information regarding the alternator 414 or the starter motor 412 to be tested similar to information contained in a radio frequency identifier (RFID). Alternatively, a quick response (QR) code may be utilized instead of a bar code.

During operation, the end user swipes or aims the bar code reader 218 over the bar code that is associated with the particular alternator 414 or starter motor 412 to be tested and reads the bar code accordingly. The bar code itself may be affixed to the alternator 414 or the starter motor 412 at the time of manufacture, purchase, shipment or service. The bar code may contain information, or point to information stored in a database. The database may be local (e.g., internal memory 208) or remotely (e.g., the external memory 210) located and accessible by the Internet 222, Ethernet, Wi-Fi, LAN, Bluetooth, near field communication, or other wireless or a wired connection. The data provided by the bar code is not limited to the examples given.

In some embodiments, the printer 214 may print bar code or QR code labels that may be attached or otherwise associated with the alternator 414 or starter and provides updated information about the component. The updated information may include, among other things, service dates, service procedures (including the results), and warranty information (e.g., time left on warranty, who was the original purchaser, what types of service are and are not warranted, etc.). The printed label may then be read by the bar code reader 218 in subsequent tests. These features can eliminate possible typographical errors during manual input and by speeding up part number selection and entry by having a scanning capability.

The present disclosure also has the ability to store and display or print technical bulletins associated with specific part numbers of components to be tested. Printouts of test results can give rebuilders access to data obtained by users to assist in the further analysis of that component.

The point-of-sale terminal 226 may be used to interact with the user or vehicle owner. At the point-of-sale terminal 226, the user may enter information such as parts number, cost of the component, credit card information, parts inventory, and the like.

The interface module 224 may comprise a database (or access the internal memory 208 or the external memory 210 that stores the database) for storing information associated with the tested components and information associated with the diagnostic test performed by the tester 102. The information associated with the tested components may include, but not limited to, alternator/starter type, serial number, bulletins, manufacturer, date of production or shipment, place of production or shipment, previous test results, electrical specifications, port connections, electrical configuration/layout, diagnostic specification, maintenance information, lot number, warranty information, a manufacture data code, method of shipment and the like. The information associated with the diagnostic test performed by the tester 102 may include, but not limited to, test specification, test values, test results (including previous test results), data, time, employee, location, weather condition before or during testing (extreme cold or heat that may affect the test) and/or any other information associated with the diagnostic test. In one aspect, the interface module 224 may be a memory unit similar to the internal memory 208.

The interface module 224 may communicate with external devices coupled to the tester 102 as discussed herein for the USB port 212 and RS-232 ports 216.

The interface module 224 may communicate with a monitoring module 234 that may control an active load of the tester 102 to monitor and detect an input power level. For example, the interface module 224 may provide an electrical specification of the alternator 414 or the starter motor 412 to be tested to the monitoring module 234 and the monitoring module 234 may monitor and control an input power level (e.g., input voltage potential and/or input current) based at least in part on the supplied electrical specification corresponding to an input and output power level of the alternator 414, for example. In one embodiment, the monitoring module 234 may set a threshold voltage potential level and/or a threshold current level of the tester 102 before testing of the alternator 414 and/or the starter motor 412, and may control an amount of load that is applied to the alternator 414 to be tested based at least in part on the threshold voltage potential level and threshold current level. If the alternator 414 or the starter motor 412 to be tested can only supply a maximum load current of 15 amps or 25 amps, then the monitoring module 234 may monitor the input power level in order to control that the input power level does not exceed a predetermined threshold.

In order to control the input power, the monitoring module 234 may lower or cut off the load applied to the alternator 414 if the input power level exceeds a threshold power level. In another embodiment, the monitoring module 234 may automatically disengage the tested component from the tester 102 or stop the testing cycle if the input power level exceeds a threshold power level. For example, the monitoring module 234 may automatically trip a breaker circuitry 418 (shown in FIG. 4) when the input power level exceeds a predetermined threshold. In another example, the monitoring module 234 may provide an indication (e.g., visual or sound) to a user when the input power level exceeds a predetermined threshold and the user may manually cutoff the input power supply via the main power switch 136, or may manually disengage the tested component from the tester 102.

In one embodiment, the monitoring module 234 may continuously or intermittently monitor and detect an input power level of the tester 102. The monitoring module 234 may also verify whether the proper voltage potential and/or current is supplied to the tested component based at least in part on the information of the alternator 414 or the starter motor 412 to be tested.

In another embodiment, during different stages of the test, different loads may be applied to the tested component and thus may require different input power levels to perform the test. The monitoring module 234 may monitor input power level at different stages of the test performed by the tester 102 and at any stage of the diagnostic test, the monitoring module 234 may terminate the test when the input power level exceeds a predetermined threshold. In another exemplary embodiment, the monitoring module 234 may monitor input power level at a first stage of the test to determine either to continue the test to a second stage or terminate the test based at least in part on the input power level during the first stage.

In one embodiment, the monitoring module 234 may monitor the bi-directional communication link between the alternator 414 and the processor 204 and/or the external computing device 220. The bi-directional communication link may be indicated as active at the peripheral module ports 302 and/or the communication port 480 by the monitoring module 234 detecting a preset signal parameter (e.g., voltage amplitude, phase, bit sequence, etc.), as discussed with respect to FIG. 5.

The monitoring module 234 may include galvanic isolated current monitoring circuit and voltage monitoring circuits. For example, galvanic isolated current and voltage monitoring circuits may include capacitive galvanic isolated circuit, inductive galvanic isolated circuit, electromagnetic galvanic isolated circuit, optical galvanic isolated circuit, acoustic galvanic isolated circuit, mechanical galvanic isolated circuit and other types of galvanic isolated circuits. The monitoring module 234 may be coupled to the input power circuitry of the tester 102 to monitor an input power of the tester 102. For example, the input power circuitry of the tester 102 and the monitoring module 234 may be coupled to different ground potentials and thus may enable the monitoring module 234 to prevent unwanted current to flow to the tested component.

The monitoring module 234 may communicate with external data sources (not shown) to transmit and receive information of various equipment (e.g., the alternator 414 or the starter motor 412) to be tested. In an exemplary embodiment, the monitoring module 234 may receive updated electrical specification information of various equipment to be tested. The monitoring module 234 may be customized by a user of the tester 102. For example, the monitoring module 234 may create a list of equipment to be tested by a user. The information of the equipment to be tested may include, but is not limited to, equipment type, serial number, manufacturer, date of production or shipment, electrical specifications, port connections, electrical configuration/layout, diagnostic specification, maintenance information, serial number, lot number, warranty information, a manufacture data code and the like.

The processor 204 may also interact with a networked computer, LAN (local area network), a smartphone, cellular phone or a distributed network, such as the Internet 222 and the like. This connection allows the user to update the tester 102 and also send information regarding the test results to a remote location. The information sent or received may include software, firmware, language, weather reports and database for the components to be tested or to the tester 102, or results of the component that was tested.

The tester motor 230 may be provided in order to test alternators. The tester motor 230 may simulate the engine of a vehicle and include a pulley to mate with a belt on the alternator 414. At one end, the belt may be coupled to the tester motor's 230 pulley and at the other end may be coupled to the pulley of the alternator 414 to be tested. In one aspect, the pulley of the alternator 414 in the tester 102 may be of a variable size. For example, the belt may be placed on different grooves of the multi-groove alternator drive pulley 138 to vary a rotational input provided to the alternator 414.

Figure 3:
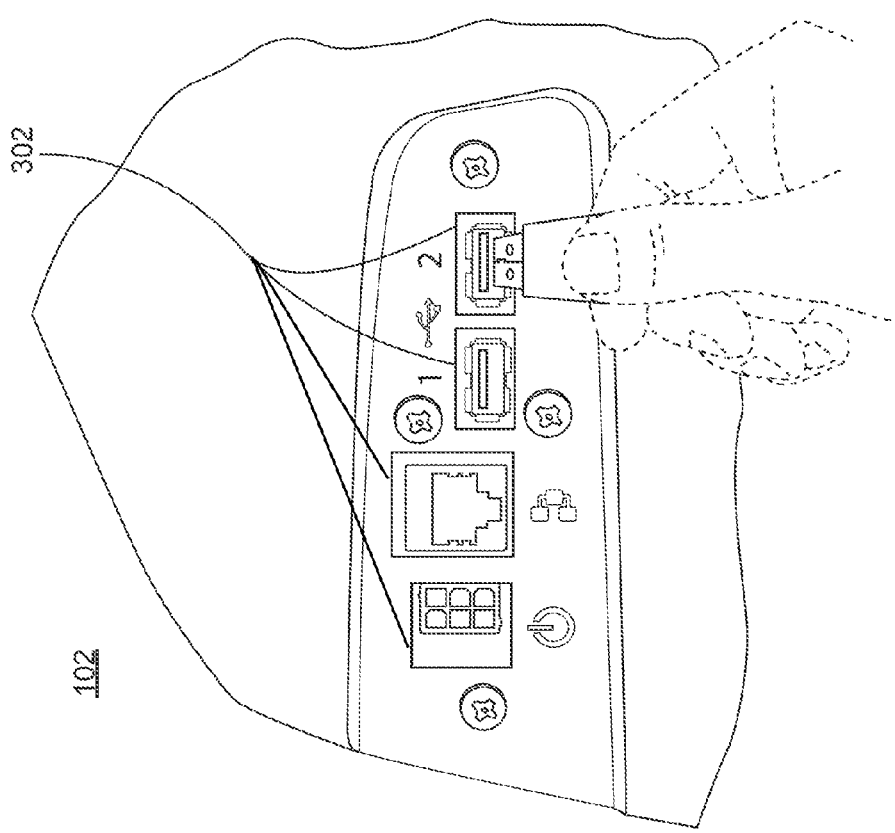
FIG. 3 is a perspective view of the peripheral and remote connections of the tester, according to an exemplary embodiment of the present disclosure.

Referring to FIG. 3, in some embodiments of the tester 102, network connectivity may be used to track tests based on part number, employee and location in order to improve accuracy of the diagnostic test. The peripheral module ports 302 may be used to communicate to various peripheral devices such as a mouse, a keyboard, or a printer as well as to receive updates and/or downloads from a connected device such as a laptop or personal computer (e.g., to the external computing device 220). In another exemplary embodiment, the peripheral module ports 302 may be large-scale communication network ports that can be constructed and arranged to receive an information relay device, such as an Ethernet wired module and/or an Ethernet wireless module. The Ethernet modules communicate at data rates of 10 Mbps (10Base-T Ethernet), 100 Mbps (Fast Ethernet), 1000 Mbps (Gigabit Ethernet) and other data rates. The information relayed can include data from the result of an alternator or starter test, the part's warranty information, the part type, the part make and model, previous tests, updates, diagnostic or operating parameters of the alternator 414 and the starter motor 412, maintenance data of the alternator 414, the tester motor 230, and a starter motor 412 separate from the tester motor 230, and any other data required by the operator.

Figure 4:
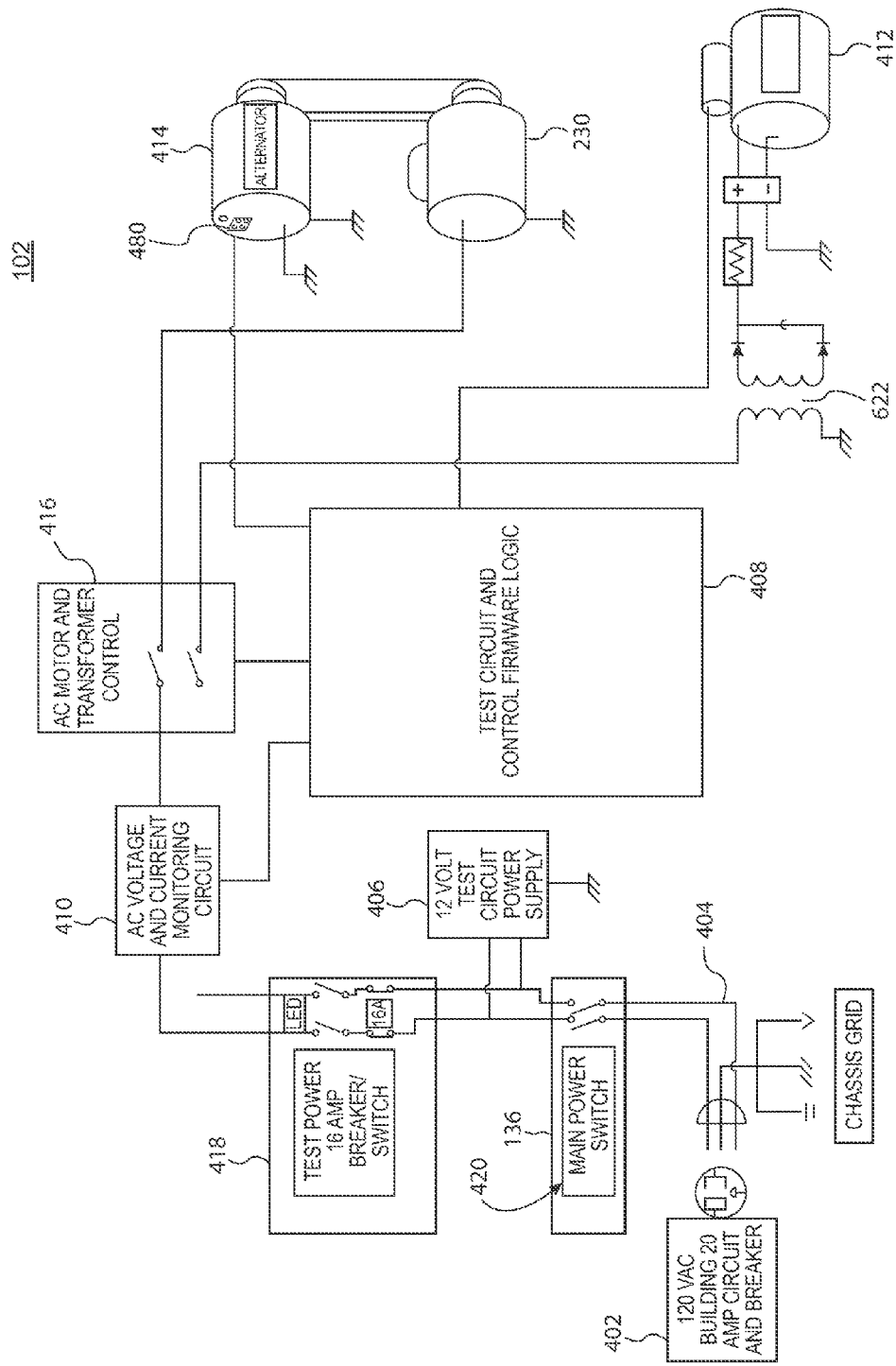
FIG. 4 illustrates a circuit schematic diagram of the tester according to an exemplary embodiment of the present disclosure.

FIG. 4 illustrates a circuit schematic diagram of the tester 102, according to an embodiment of the present disclosure. The tester 102 may be coupled to an external power source 402 (e.g., an alternating current (AC) power source) via an electrical connection 404. In an exemplary embodiment, the external power source 402 may be a 120V alternating current (AC) and 20A power source to power an operation of the tester 102. The tester 102 may also include a power switch 420 (connected to the main power switch 136) and a power supply circuitry 406. The power switch 420 may be switched by a user to turn the tester 102 "ON" to perform a diagnostic test of vehicular components and may be switched to an "OFF" position when testing has been completed. The power supply circuitry 406 may include a transformer circuitry and a rectifier circuitry (not shown) for converting the power received from the external power source 402 into a power that may be used by the tester 102. In an exemplary embodiment, the transformer circuitry of the power supply circuitry 406 may convert the 120V alternating current (AC) power signal to a 12V alternating current (AC) power signal. The rectifier circuitry (not shown) of the power supply circuitry 406 may convert (e.g., rectify) the 12V alternating current (AC) power signal to a 12V direct current (DC) power signal to power the tester 102.

For example, the power supply circuitry 406 may supply power to a test and control circuitry 408 to run the transformer 422 and the tester motor 230 (or, any other AC motor) via a drive control circuitry 416. The test and control circuitry 408 may provide one or more control signals to the drive control circuitry 416 to control the a power level supplied to the transformer 422 and the tester motor 230 to perform diagnostic tests and the alternator 414, respectively. During the diagnostic test, the monitoring circuitry 410 (that is a part of the monitoring module 234) may monitor an input power level (e.g., input voltage potential and/or input current) to the tester 102. In the event that the input power level exceeds a predetermined threshold, the monitoring circuitry 410 may cutoff the power supply to the tester motor 230 or the transformer 422 via the drive control circuitry 416 to stop the diagnostic test. The breaker circuitry 418 may include a switch that may allow a user to manually turn the switch ON and OFF to cutoff the power supply to stop the diagnostic test. Also, the breaker circuitry 418 may include a breaker that may be tripped when the monitoring circuitry 410 detects that the power level exceeds a predetermined threshold.

For example, the monitoring circuitry 410 may monitor the power level (e.g., voltage potential and/or current) at different stages of the diagnostic test. During any stage of the test, the monitoring circuitry 410 may terminate the test when the input power level exceeds a predetermined threshold by turning off the drive control circuitry 416. In another exemplary embodiment, the monitoring circuitry 410 may monitor a power level at a first stage of the diagnostic test to determine either to continue the diagnostic test to a second stage or terminate the diagnostic test by turning off the drive control circuitry 416. In another exemplary embodiment, the monitoring circuitry 410 may cutoff the power supply during any stage of the diagnostic test when the power level exceeds a predetermined threshold. The monitoring circuitry 410 may be in communication with the processor 204 and/or the processor inside the alternator 414 to carry out the monitoring.

Figure 5:
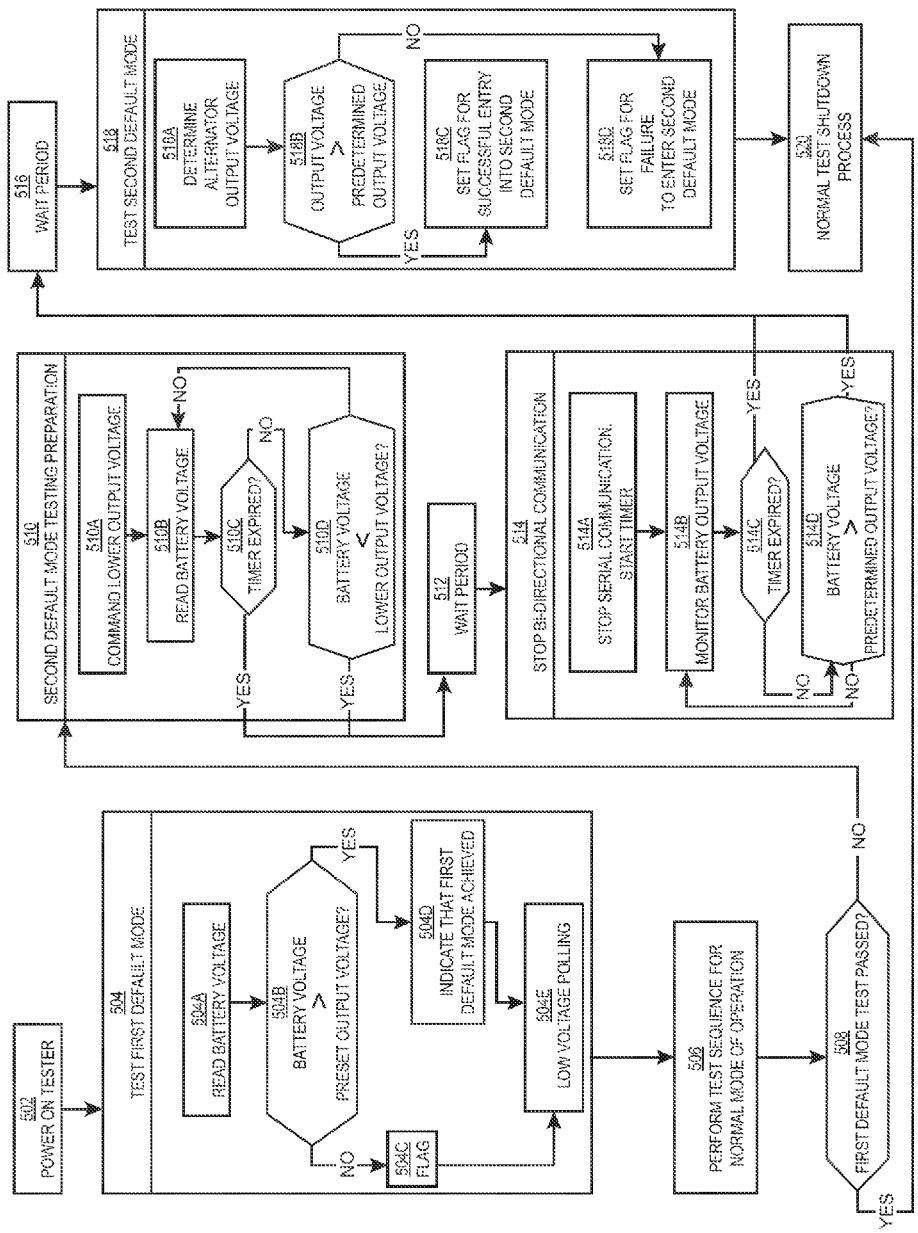
FIG. 5 illustrates a flowchart for a method for testing a default mode of operation of an alternator in connection with the tester of FIG. 1, according to an exemplary embodiment of the present disclosure.

Referring to FIG. 5, a flowchart for a method 500 for testing a default mode of operation of the alternator 414 of FIG. 4 is illustrated, according to an exemplary embodiment of the present disclosure. FIG. 5 presents the method 500 as a flow diagram, although the method 500 may be understood using other types of presentations such as process diagrams, graphs, charts, equations, timing diagrams, etc. In one aspect, one or more processes or operations in the method 500 may be carried out by the processor 204 of the tester 102. The method 500 may at least partially be implemented by executing the computer executable instructions stored in the internal memory 208. In another aspect, at least one operation in the method 500 may be carried out by a processor inside the alternator 414 to be tested on the tester 102. For example, a regulator of the alternator 414 may include a processor that carries out or communicates with the processor 204 to provide information related to the method 500 for testing the alternator 414.

In yet another aspect, in the method 500, one or more processes or operations, or sub-processes thereof, may be skipped or combined as a single process or operation, and a flow of processes or operations in the method 500 may be in any order not limited by the specific order illustrated in FIG. 5. For example, one or more processes or operations may be moved around in terms of their respective orders, or may be carried out in parallel. The term "flow," as used with respect to FIG. 5, generally refers to a logical progression of operations in an exemplary manner carried out by the processor 204. However, such a flow is by way of example only and not by way of limitation, as at a time, the flow may proceed along multiple operations or processes of the method 500. Further, the method 500 may be carried out by the processor 204 for various types of alternators and is not limited to a particular type of alternator. The method 500 may be implemented by the processor 204 in a high level or a low level programming language (e.g., C++, assembly language, etc.) using logic circuitry within the tester 102 (e.g., the DSP 206, the monitoring module 234, etc.) and by executing the computer executable instructions in the internal memory 208. In one aspect, the internal memory 208 of the tester 102 for the alternator 414 may include a non-transitory computer readable medium. The non-transitory computer readable medium may include instructions thereupon, which when executed by the processor 204 of the tester 102 cause the processor 204 to implement the method 500.

Furthermore, it will be appreciated that the operations in the method 500 may be carried out by the processor 204, the external computing device 220, a processor inside the alternator 414 (e.g., inside a regulator of the alternator 414), or combinations thereof, as will be understood by one of ordinary skill in the art in view of this disclosure. Therefore, any reference made to the processor 204 may apply equally to the processor in the alternator 414 and/or the external computing device 220.

The method 500 may begin in an operation 502 in which the tester 102 is powered on or started, for example, using the main power switch 136. In one aspect, at power on, the tester 102 may include the alternator 414 coupled to the tester 102 on the alternator rest pad 134, as well as the tester motor 230 placed between the support pad 130 and the tester motor top support pad 142. The alternator 414 may be driven by the tester motor 230 in the operation 502, via the multi-groove alternator drive pulley 138 receiving a rotational input from the tester motor 230. Such rotational input may be at a predetermined angular speed. For example, the alternator 414 may ideally enter a default mode only upon receiving the rotational input at the predetermined angular speed, but not when the rotational input is below that predetermined angular speed.

In another aspect, the starting of the tester 102 may include providing various engine controller signals to the alternator 414 over the communication bus 228. The engine controller signals may be provided to the alternator 414 at the communication port 480 of the alternator 414. The engine controller signals may be associated with a plurality of sensors in a vehicle. For example, the engine controller signals provided to the alternator 414 via the communication bus 228 may be electrical signals for at least one physical parameter of the vehicle including but not limited to battery voltage, tire pressure, engine temperature, hydraulic flow, and the like. The engine controller signals may be generated to simulate the physical parameters that are provided to the alternator 414 from an engine controller (not shown), as would happen once the alternator 414 has been installed inside a vehicle. By way of example only, such engine controller signals may be generated by the processor 204 and/or may be generated by the external computing device 220 and forwarded to the alternator 414 via the processor 204.

In one aspect, the communication bus 228 may form a bi-directional communication link between the alternator 414 and the tester 102. Such bi-directional communication link is "bi-directional" in the sense that information can flow to the alternator 414 as well as from the alternator 414 to the processor 204 or beyond, e.g., to the external computing device 220. In this respect, the alternator 414 is a bi-directional type alternator configured to receive data from external devices (e.g., an engine controller or the external computing device 220) and send data to such external devices. For example, the external computing device 220 may be used to generate or simulate signals that an engine controller or another electronic control unit (ECU) in a vehicle may provide to the alternator 414 via the communication port 480 over the communication bus 228. The alternator 414 under test may provide return signals to the processor 204 and/or the external computing device 220 as a feedback to the signals received. The feedback may include voltage, temperature, current, and the like or combinations thereof, for the alternator 414.

In an operation 504, the alternator 414 is tested for a first default mode of operation following a startup of the alternator 414 in the operation 502. The term "default mode" refers to an operational mode of the alternator 414 under test to provide a predetermined output voltage that is supplied to the vehicle's electrical system when normal course of operation of the alternator 414 does not initiate at all, is not possible, or is disrupted. Such normal course of operation is related to the alternator 414 receiving appropriate input(s) from a tester motor 230 and/or an engine output shaft in a vehicle, or under a test scenario in the tester 102, receiving appropriate rotational input from the tester motor 230, and providing a normal voltage output (in DC) required for proper operation of the vehicle's electrical system. A default mode, such as the first default mode in the operation 504, is a mode of operation of the alternator 414 that may occur when an unexpected or an abnormal event occurs, with the vehicle (or the tester 102) and/or the alternator 414. Upon such an event, the vehicle still needs to be provided with proper electrical output so that the vehicle may operate under a limp home mode or at least allow a vehicle operator to maneuver the vehicle to safety prior to initiating remedial procedures on the vehicle. To allow this, the alternator 414 should ideally enter one or more of the default modes properly.

The first default mode of the operation 504 may include an operation 504a in which the processor 204 or the processor in the alternator 414 may read output battery voltage of the alternator 414. The processor 204 may obtain the output battery voltage of the alternator 414 from a regulator/controller of the alternator 414. For example, using the monitoring module 234, the processor 204 of the tester 102 may monitor the communication port 480 at which a communication signal arrives at the alternator 414 to determine whether the bi-directional communication between the alternator 414 and the processor 204 is present or absent. The communication signal may be simulated by the processor 204 and/or the external computing device 220 to include at least one parameter associated with a vehicle. In one aspect, such a determination may include monitoring a value of at least one physical parameter of the vehicle indicated by the communication signal at the communication port 480. Such a physical parameter may include, but is not limited to, sensor output signals, battery voltages, tire pressure, temperature, current output from one or more electrical components of the vehicle, electrical parameters and signal levels, and the like, or combinations thereof. In another aspect, such information regarding the absence or the presence of the communication signal may be obtained by the processor 204 from the communication port 480 of the alternator 414.

Then in an operation 504b, the processor 204 may determine whether the battery voltage read in the operation 504a is greater than a predefined battery voltage or a threshold battery voltage for the first default mode. Such predefined battery voltage may be stored in the internal memory 208 and accessed by the processor 204 when the operation 504 (or, the operation 504b) is carried out. The battery voltage outputted may correspond to an absence of any communication at the startup (in the operation 502) between the alternator 414 and the processor 204 and/or the external computing device 220 at the communication port 480. For example, at the startup of the alternator 414, a bi-directional communication between the alternator 414 and the processor 204 over the communication bus 228 may be missing or absent. Such missing or absent bi-directional communication may simulate a scenario when the alternator 414, when placed inside a vehicle or a machine, loses communication with the engine controller and/or other ECUs, or does not have any communication at a startup of the vehicle to begin with.

In an operation 504c, if the battery voltage detected is below the threshold battery voltage, the processor 204 may set a flag in the internal memory 208 to indicate that the alternator 414 did not achieve the first default mode of operation. However, in an operation 504d, if the battery voltage detected is above the threshold battery voltage, the processor 204 may set a flag in the internal memory 208 to indicate that the alternator 414 achieved the first default mode of operation. In one aspect, the flag may be set with one or more additional conditions for the alternator 414 to have not entered the first default mode. For example, the processor 204 may determine that the alternator 414 did not enter the first default mode after receiving the rotational input at a predefined angular speed (e.g., 2000 rpm), stored in the internal memory 208, from the tester motor 230.

In an operation 504e, the processor 204 may turn on low voltage polling over the communication link with the alternator 414 (formed by the communication bus 228 coupled to the communication port 480). Generally, such low voltage polling is a request for communication from the processor 204 with the alternator 414. Such polling may initiate or attempt to initiate a communication with the alternator 414 when an absence of the bi-directional communication between the alternator 414 and the processor 204 is detected.

In an operation 506, the tester 102 may perform additional test sequences for the alternator 414 under a normal mode of operation. For example, if the first default mode of operation was not detected, or an output voltage of the alternator 414 corresponded to a normal mode of operation, the tester 102 may carry out other types of tests on the alternator 414. In one aspect of this disclosure, the operation 510 may be optional and may be skipped by the processor 204.

In an operation 508, the processor 204 checks the flag set in the internal memory 208 to determine whether the alternator 414 passed or failed the test for the first default mode. If the processor 204 determines that the alternator 414 passed the test, the method 500 proceeds to the operation 520 in which the tester 102 performs a shutdown process for the alternator 414 under test. The alternator 414 is then deemed as tested for successfully entering at least one default mode (i.e., the first default mode in this instance) when bi-directional communication with the alternator 414 was absent at a startup of the alternator 414.

However, if in the operation 508, the flag in the internal memory 208 indicates that the alternator 414 did not enter the first default mode at startup (in the operations 502-504), the method 500 proceeds to an operation 510. In the operation 510, the processor 204 determines if the alternator 414 enters a second default mode based upon the message polling carried out in the operation 504e. The message polling includes bit requests to obtain output voltage of the alternator 414.

In an operation 510a, in preparation for testing the alternator 414 for the second default mode, the processor 204 instructs the alternator 414 to output a value of the output voltage lower than a normal output voltage of the alternator 414. For example, the processor 204 may send a message with a bit sequence 011010, and may command the alternator 414 under test to output 11.8V corresponding to the bit sequence, although other values of the output voltage may be programmed depending upon a type of the alternator 414 under test, as different vehicles may have different alternator requirements. Concurrently, the processor 204 starts a timer for a first time period. For example, the first time period implemented by the timer may be equal to 3 s, although the first time period may be programmable, for example, depending upon a type of the alternator 414.

In an operation 510b, the processor 204 reads a battery voltage provided by the alternator 414. This is done because some parts of the tester 102 may require, for example, 10 s to allow the default mode to start of the voltage change to happen. Such reading may be carried out by the processor 204 using the monitoring module 234 of the tester 102. In an operation 510c, the processor 204 then determines if the timer implemented by the processor 204 for the first time period has expired. If yes, then the method 500 proceeds to an operation 512. If not, the method 500 proceeds to an operation 510d. In the operation 510d, the processor 204 determines if the battery voltage read by the processor 204 is less than the lower output voltage commanded by the processor 204 in the operation 510a. If not, the operation 510b is executed again where the battery voltage is read by the processor 204.

In the operation 512, the processor 204 waits for a second time period so that the output voltage of the alternator 414 stabilizes to the commanded lower voltage value, or to confirm that the output voltage from the alternator 414 has indeed achieved a stable value. For example, the processor 204 may wait for 1 s, although the second time period may be variable and programmable by the processor 204 depending upon different types of the alternator 414.

In an operation 514, after the second period of time has expired, the processor 204 stops the bi-directional communication between the alternator 414 and the communication bus 228. The processor 204 may stop the bi-directional communication by disconnecting the communication bus 228 between the alternator 414 and the tester 102. Such disruption in the bi-directional communication at the communication port 480 simulates a real life scenario in which the communication link between an alternator and an engine control module or another ECU of a vehicle is disrupted for any reason. For example, such disruption may occur when a sensor of a vehicle providing data to the engine controller of a vehicle malfunctions, and therefore, the engine controller stops sending that data to the alternator 414. Ideally, the alternator 414 may not continue to provide the same electrical output to the vehicle's electrical system even when the sensor has malfunctioned and is not consuming any electrical power. As a result of a decrease in the output voltage of the alternator 414 to account for a lower electrical demand by the vehicle's electrical system (in view of the sensor malfunction), the rotational input to the alternator 414 may be reduced, and hence, the engine may consume lesser fuel than when the alternator 414 was operating at full output voltage. This leads to better fuel efficiency for the engine.

In an operation 514a, the processor 204 may, for example, stop a serial communication with the alternator 414. Such disruption of the bi-directional communication between the alternator 414 and the communication bus 228 may be partial or complete. For example, only certain channels of data may be allowed for a partial disruption, whereas no data flows in and out of the communication port 480 in a complete disruption. The alternator 414 and/or the processor 204 may detect such an absence of the communication to and from the alternator 414 by polling the communication port 480. Further, in the operation 514a, the processor 204 may start another timer for a third time period. By way of example only and not by way of limitation, the third time period may be equal to 15 s, although, as indicated elsewhere herein with respect to other time periods, the value of the third time period may be programmable using the tester 102 for different types of alternators. In one aspect, the processor 204 may disconnect the communication bus 228 between the alternator 414 and the tester 102 to detect the absence of the communication signal at the alternator 414.

In an operation 514b, the processor 204 may monitor the battery voltage output from the alternator 414 using the monitoring module 234 in the tester 102. In an operation 514c, the processor 204 then determines if the timer for the third time period has expired. If yes, then the method 500 proceeds to an operation 516. If not, the method 500 proceeds to an operation 514d. In the operation 514d, the processor 204 determines if the battery voltage read by the processor 204 is less than a predetermined output voltage for the second default mode in which an absence of communication was detected by the processor 204 and/or the processor in the alternator 414. If not, the operation 514b is executed again where the battery voltage is read by the processor 204. If yes, the method 500 proceeds to the operation 516.

In the operation 516, the processor 204 waits for a fourth time period so that the output voltage of the alternator 414 stabilizes to the output voltage for the second default mode, or to confirm that the output voltage has indeed reached a stable value. For example, the processor 204 may wait for 2s, although the value of the fourth time period may be programmable using the tester 102 for different types of alternators.

In an operation 518, the processor 204 may check the alternator 414 for the second default mode of operation of the alternator 414 corresponding to the absence of the communication caused by a disruption of the communication between the alternator 414 and the communication bus 228 (and/or the external computing device 220). As discussed, a real life scenario may exist for the alternator 414 under test when inside a vehicle, the alternator 414 may lose bi-directional communication with the engine controller and/or other ECUs of the vehicle. In such a scenario, ideally the alternator 414 should automatically switch to a default mode (e.g., corresponding to the second default mode simulated in the tester 102 and described with respect to the operation 518).

The operation 518 may include an operation 518a in which the processor 204 reads or determines the alternator 414 output voltage after stabilization (in the operation 516). In one aspect, the processor 204 may store the alternator 414 output voltage in the internal memory 208 of the tester 102.

In an operation 518b, the processor 204 may compare the read alternator 414 output voltage with the output voltage defined for the second default mode (with the communication with the alternator 414 disrupted) and stored in the internal memory 208. If the current alternator 414 output voltage read by the processor 204 is greater than the predetermined output voltage for the second default mode, the method 500 proceeds to an operation 518c in which the processor 204 sets a flag in the internal memory 208 indicating that the alternator 414 went into the second default mode properly. Alternatively, the processor 204 may indicate that the alternator 414 successfully entered the second default mode by outputting an indication signal (an audio signal, an optical signal, or both) indicating that the alternator 414 has been tested successfully for the second default mode. Subsequently, an operator of the tester 102 may remove the alternator 414 from the tester 102 and record that the alternator 414 was successfully tested for the default mode of operation.

However, if in the operation 518b, the processor 204 determines that the alternator 414 output even after the stabilization is below the predetermined output voltage for the second default mode, then in an operation 518d, the processor 204 sets a flag in the internal memory 208 indicating that the alternator 414 did not enter the second default mode of operation. Alternatively, the processor 204 may indicate that the alternator 414 failed to enter the second default mode by outputting an indication signal (an audio signal, an optical signal, or both) indicating that the alternator 414 failed a test for the second default mode of operation when the bi-directional communication with the alternator 414 was intentionally disrupted by the processor 204. Subsequently, an operator of the tester 102 may record that the alternator 414 was tested for the second default mode of operation, but failed to enter the second default mode of operation.

The method 500 then proceeds to the operation 520 where the normal test shutdown procedure is initiated for the alternator 414 and the tester 102. After shutdown, the alternator 414 may be removed from the tester 102 and results of testing using the method 500 may be provided to the external computing device 220 for analysis.

Various aspects of this disclosure test the default modes of a bidirectional communication type alternator (e.g., the alternator 414) placed in the tester 102. One such default mode occurs at an independent activation or "startup" of the alternator 414 (as discussed in the operation 504). This may require the alternator 414 to start up without any communication, powered by an on-system battery voltage via a power supply. In some aspects, the alternator 414 may require the shaft speed of the tester motor 230 to be at or above 3000 rpm, or above 3000 rpm, to enable the default mode, the shaft speed corresponding to the rotational input to the alternator 414. The minimum shaft speed being a condition for the testing, not all alternators will reach this minimum shaft speed with the limitation of a fixed speed motor (e.g., the tester motor 230) and then dependent on the pulley dimensions for the fixed pulley on tester motor 230 and the variable pulley (implemented by the multi-groove alternator drive pulley 138) on the alternator 414, the alternator 414 may only output a fixed output voltage.

In another aspect, the second default mode of the alternator 414 occurs after successful bi-directional communication and regulation has been started with the alternator 414, and once the bi-directional communication is stopped or lost the alternator 414 will go into a default mode (e.g., the second default mode discussed in the operations 514-518). This transition to the second default mode is variable from alternator to alternator. The transition can vary from 1 to 10 seconds after the communication loss, and the testing of the alternator 414 will not stop prior to the activation of the second default mode.

Various aspects of this disclosure solve this issue of the variable time of the transition to the second default mode by testing if the standalone default startup of the alternator 414 has happened. If yes, the alternator 414 will turn on and produce an output voltage. If the default mode has not occurred, testing of the alternator 414 will continue on as is, under a normal mode of operation of the alternator 414.

If one or more of the default modes in a standalone testing of the alternator 414 on the tester 102 has not activated, the loss of the bi-directional communication in the test process of the method 500 will then be used at the end of a standard test, meaning the established communication will be removed and then the alternator 414 is allowed up to 15 seconds to respond. The preset output voltage of the alternator 414 is commanded by the processor 204, for example, to 11.8 volts to allow the transition from a controlled output voltage to a default voltage of 13.5 volts or more. The bi-directional communication protocol is removed or turned off, and the alternator 414 is then given, for example, up to 15 seconds to transition to the second default mode. Accordingly, using the method 500, the alternator 414 having a bi-directional communication capability with an engine controller and other ECUs may be tested for default modes of operation of the alternator 414, prior to use inside a vehicle.

The many features and advantages of the present disclosure are apparent from the detailed specification, and thus, it is intended by the appended claims to cover all such features and advantages of the present disclosure, which fall within the true spirit, and scope of the present disclosure. Further, since numerous modifications and variations will readily occur to those skilled in the art, it is not desired to limit the present disclosure to the exact construction and operation illustrated and described, and accordingly, all suitable modifications and equivalents may be resorted to, falling within the scope of the present disclosure.

What is claimed is:

1. A method for testing a default mode of an alternator, the method comprising:
   detecting, with a processor of a tester, an absence of a communication signal at an alternator coupled to the tester, said communication signal being simulated by the tester to include at least one parameter associated with a vehicle;
   testing, with the processor, upon said detecting, whether or not the alternator enters a default mode of operation, the default mode being indicated by a preset output voltage uniquely associated with the default mode and monitored by the processor; and
   indicating, with the processor, whether the alternator failed or passed said testing.

2. The method of claim 1, further comprising:
   monitoring, with the processor, a communication port of the alternator for the communication signal, wherein the detecting the absence is carried out based upon a value of the at least one parameter associated the vehicle indicated by the communication signal at the communication port.

3. The method of claim 1, wherein the testing is carried out after a first period of time has elapsed after the detecting.

4. The method of claim 1, wherein the absence is detected after a startup of the alternator.

5. The method of claim 1, wherein the detecting is carried out based upon the processor disconnecting a communication bus between the alternator and the tester.

6. The method of claim 1, wherein the alternator enters the default mode upon receiving a rotational input from a tester motor at a predetermined angular speed.

7. The method of claim 6, wherein the testing whether or not the alternator enters the default mode includes determining that the alternator does not enter the default mode after receiving the rotational input from the tester motor.

8. The method of claim 1, further comprising:
   receiving, with the processor, a rotational input from a tester motor at a startup of the alternator, wherein the detecting is carried out upon said receiving the rotational input.

9. The method of claim 8, further comprising:
   operating the alternator in the default mode based upon the detecting the absence of the communication signal upon said receiving.

10. A tester for a default mode of operation of an alternator, the tester comprising:
    an internal memory having computer executable instructions; and
    a processor coupled to the internal memory and to an alternator via a communication bus, the processor configured to execute the computer executable instructions in the internal memory to:
      provide at least one parameter associated with a vehicle to the alternator simulated as a communication signal over the communication bus;
      detect an absence of the communication signal at the alternator;
      test, upon said absence, whether or not the alternator enters a default mode of operation, the default mode being indicated by a preset output voltage uniquely associated with the default mode and monitored by the processor; and
      indicate whether the alternator entered the default mode successfully.

11. The tester of claim 10, wherein the processor is further configured to:
    monitor the communication signal at a communication port of the alternator, wherein the absence is detected based upon a value of the at least one parameter of the vehicle in the communication signal at the communication port.

12. The tester of claim 10, wherein the processor is configured to wait for a first period of time after the absence to test whether or not the alternator enters the default mode of operation.

13. The tester of claim 10, wherein the processor is configured to wait for a second period of time to detect the preset output voltage of the alternator to test the default mode of operation.

14. The tester of claim 10, wherein the alternator includes a communication port for bi-directional communications.

15. The tester of claim 10, wherein the alternator is configured to receive a rotational input of 3000 rotations per minute (RPM) from a tester motor of the tester and output the preset output voltage of at least 13.5V in response to the rotational input.

16. The tester of claim 10, wherein the processor is configured to test whether or not the alternator enters the default mode by determining that the alternator does not enter the default mode after receiving a rotational input from a tester motor coupled to the tester.

17. The tester of claim 10, wherein a tester motor coupled to the tester is configured to provide a rotational input to the alternator at a startup, the processor being configured to detect the at least one parameter at a communication port of the alternator indicating the absence of the communication signal upon the startup.

18. The tester of claim 17, wherein the absence of the communication signal is caused by the processor disconnecting the communication bus.

19. The tester of claim 10, wherein a rotational input is provided by a drive belt coupling a fixed pulley of a tester motor to a variable sized pulley of the alternator, the preset output voltage being a function of a size of the variable sized pulley.

20. A non-transitory computer readable medium of a tester for an alternator, the non-transitory computer readable medium including computer executable instructions thereupon, which when executed by a processor of the tester cause the processor to:
    provide at least one parameter associated with a vehicle to the alternator simulated in a communication signal over a communication link;
    detect an absence of the communication signal at the alternator;
    test, upon said absence, whether or not the alternator enters a default mode of operation, the default mode being indicated by a preset output voltage uniquely associated with the default mode and monitored by the processor; and
    indicate whether the alternator entered the default mode successfully.

* * * * *